(12) United States Patent
Trigwell et al.

(10) Patent No.: US 8,513,531 B2
(45) Date of Patent: Aug. 20, 2013

(54) ELECTRODYNAMIC ARRAYS HAVING NANOMATERIAL ELECTRODES

(75) Inventors: Steven Trigwell, Merritt Island, FL (US); Alexandru S. Biris, Little Rock, AR (US); Carlos I. Calle, Merritt Island, FL (US)

(73) Assignee: The Board of Trustees of the University of Arkansas, Little Rock, AR (US)

( * ) Notice: Subject to any disclaimer, the term of this patent is extended or adjusted under 35 U.S.C. 154(b) by 250 days.

(21) Appl. No.: 12/804,175

(22) Filed: Jul. 15, 2010

(65) Prior Publication Data

US 2011/0011629 A1     Jan. 20, 2011

Related U.S. Application Data

(60) Provisional application No. 61/270,951, filed on Jul. 15, 2009.

(51) Int. Cl.
*H05K 1/00* (2006.01)
*B05D 5/12* (2006.01)
*H05K 1/09* (2006.01)

(52) U.S. Cl.
USPC ............ 174/254; 174/257; 977/840; 977/902

(58) Field of Classification Search
USPC ................... 174/254, 257; 427/58; 977/840, 977/902, 932
See application file for complete search history.

(56) References Cited

U.S. PATENT DOCUMENTS

| | | | |
|---|---|---|---|
| 6,911,593 B2 | 6/2005 | Mazumder et al. | |
| 6,988,925 B2 | 1/2006 | Arthur et al. | |
| 7,060,241 B2 | 6/2006 | Glatkowski | |
| 7,118,693 B2 | 10/2006 | Glatkowski et al. | |
| 7,195,754 B1 | 3/2007 | Glatkowski et al. | |
| 7,342,479 B2 | 3/2008 | Glatkowski et al. | |
| 7,378,040 B2 | 5/2008 | Luo et al. | |
| 8,009,409 B2 * | 8/2011 | Reynolds | 361/502 |
| 2009/0173935 A1 | 7/2009 | Cho et al. | |
| 2009/0181478 A1* | 7/2009 | Cox et al. | 438/22 |
| 2010/0040831 A1* | 2/2010 | Shim | 428/141 |
| 2010/0089772 A1* | 4/2010 | Deshusses et al. | 205/781 |
| 2010/0092809 A1* | 4/2010 | Drzal et al. | 429/12 |
| 2010/0328845 A1* | 12/2010 | Hiralal et al. | 361/502 |
| 2012/0111599 A1 | 5/2012 | Roberson et al. | |

OTHER PUBLICATIONS

Islam, M., et al., High Weight Fraction Surfactant Solubilization of Single-Wall Carbon Nanotubes in Water, Nano Letters, vol. 3, No. 2, pp. 269-273, Jan. 16, 2003.

O'Connell, M., et al., Reversible water-solubilization of single-walled carbon nanotubes by polymer wrapping, Chemical Physics Letters, 342, pp. 265-271, Jul. 13, 2001.

Riggs, J., et al., Strong Luminescence of Solubilized Carbon Nanotubes, J.Am.Chem.Soc. 122, pp. 5879-5880, Jun. 2, 2000.

(Continued)

*Primary Examiner* — Anatoly Vortman
(74) *Attorney, Agent, or Firm* — J. Charles Dougherty

(57) ABSTRACT

An electrodynamic array of conductive nanomaterial electrodes and a method of making such an electrodynamic array. In one embodiment, a liquid solution containing nanomaterials is deposited as an array of conductive electrodes on a substrate, including rigid or flexible substrates such as fabrics, and opaque or transparent substrates. The nanomaterial electrodes may also be grown in situ. The nanomaterials may include carbon nanomaterials, other organic or inorganic nanomaterials or mixtures.

10 Claims, 1 Drawing Sheet

(56) References Cited

OTHER PUBLICATIONS

Sun, Y., et al., Functionalized Carbon Nanotubes: Properties and Applicatons, Accounts of Chemical Research, vol. 35, No. 12, pp. 1096-1104, Nov. 23, 2002.

Pompeo, F., et al., Water Solubilization of Single-Walled Carbon Nanotubes by Functionalization with Glucosamine, Nano Letters, vol. 2, No. 4, pp. 369-373, Jan. 26, 2002.

Banerjee, S., et al., Covalent Surface Chemistry of Single-Walled Carbon Nanotubes, Advances Materials 17, No. 1, pp. 17-29, Jan. 6, 2005.

Sun, Y., et al., High Dissolution and Strong Light Emission of Carbon Nanotubes in Aromatic Amine Solvents, J.Am.Chem.Soc., vol. 123, No. 22, pp. 5348-5349, May 11, 2001.

Huang, W., et al., Sonication-Assisted Functionalization of Solubilization of Carbon Nanotubes, Nano Letters, vol. 2, No. 3, pp. 231-234, Feb. 2, 2002.

Kam, N., et al., Carbon nanotubes as multifunctional biological transporters and near-infrared agents for selective cancer call destruction, PNAS, vol. 102, No. 33, pp. 11600-11605, Aug. 16, 2005.

Georgakilas, V., et al., Organic Functionalization of Carbon Nanotubes, J.Am.Chem.Soc., vol. 124, No. 5, pp. 760-761, Jan. 8, 2002.

Hill, D., et al., Functionalization of Carbon Nanotubes with Polystyrene, Macromolecules, vol. 35, No. 25, pp. 9466-9471, Nov. 5, 2002.

Huang, W., et al., Solubilization of Single-Walled Carbon Nanotubes with Diamine-Terminated Oligomeric Polyethylene Glycol) in Different Functionalization Reactions, Nano Letters, vol. 3, No. 4, pp. 565-568, Mar. 12, 2003.

Li, Z., et al., SOCl2 enhanced photovoltaic conversion of single wall carbon nanotube/n-silicon heterojunctions, Applied Physics Letters 93, pp. 243117-1-243117-3, Dec. 17, 2008.

Li, Z., et al., Comparative Study on Different Carbon Nanotube Materials in Terms of Transparent Conductive Coatings, Langmuir, vol. 24, No. 6, pp. 2655-2662, Feb. 6, 2008.

\* cited by examiner

ELECTRODYNAMIC ARRAYS HAVING NANOMATERIAL ELECTRODES

CROSS-REFERENCE TO RELATED APPLICATIONS

This application claims the benefit of U.S. Provisional Patent Application No. 61/270,951 filed Jul. 15, 2009, which is incorporated herein by reference in its entirety.

GOVERNMENT RIGHTS STATEMENT

The invention described herein was made in the performance of work under a NASA contract and by an employee of the United States Government and is subject to the provisions of Public Law 96-517 (35 U.S.C. §202) and may be manufactured and used by or for the Government for governmental purposes without the payment of any royalties thereon or therefore.

BACKGROUND OF THE INVENTION

1. Field of the Invention

The present invention relates to electrodynamic arrays, and in particular, to electrodynamic arrays having electrodes formed from nanomaterials.

2. Brief Description of the Related Art

The electrodynamic screen is a well documented technology for dust mitigation applications. For example, U.S. Pat. No. 6,911,593 discloses a transparent self-cleaning dust shield for use with solar panels and the like. In an electrodynamic screen for dust mitigation, an array of electrodes are disposed on the surface of a substrate and connected to a suitable source of electric power to sweep or repel dust particles from the surface of the substrate. Electrodynamic arrays of electrodes may also be used in general for applications involving the movement and separation of particles, including biological systems.

Current rigid electrodynamic arrays use indium-tin oxide (ITO) or other metals as the electrodes. However, these materials are brittle with little flexibility. Such materials are not desirable for applications requiring flexibility, such as fabrics which may involve continuous cyclical flexing.

For non-transparent applications, aluminum and copper electrode patterns may be used to provide electrodynamic arrays. ITO is predominantly used in applications requiring optical transparency, such as where transparent electrodes are desirable. However, all these methods of making patterns of electrodynamic arrays with metal electrodes involve etching to remove the metal. This presents a limitation in applications to fabrics or similar materials. Moreover, ITO is UV degradable and, along with the other metal materials that can be used for the electrodes, cannot resist various environments such as acids.

It is desirable that various substrates (for example, polymeric substrates, optical devices, aircraft components, windshields and the like), including flexible substrates such as fabrics, be provided with electrodynamic arrays for involving the movement and separation of particles, including dust mitigation.

BRIEF SUMMARY OF THE INVENTION

The present invention is directed to a device and method that satisfies this need. In the present invention, liquid solutions (herein also referred to as "inks") of nanomaterials are deposited as arrays of electrodes on various substrates, including flexible substrates such as fabrics, transparent substrates and the like. The liquid solutions can be deposited using a number of deposition methods that include without limitation printing, electrospray, microfabrication, electrostatic deposition, self-assembly, patterning, electroprinting, and other deposition techniques known to those skilled in the art. The nanomaterials are deposited on the substrate as arrays of conductive electrodes to provide suitable electrodynamic array patterns.

Carbon nanomaterials, including, without limitation, single, double, multi-walled nanotubes, nanofibers, graphene layers, graphite, fullerenes and the like, act as conductive electrodes for electrodynamic screens and provide not only electrical conductivity but also flexibility and transparency. Inks containing carbon nanomaterials may thus be used to produce transparent conductive electrodes on a variety of substrates with conductivities comparable to ITO. Other nanomaterials that may be used in the practice of the present invention include, without limitation, metal nanostructures, metal oxide nanostructures, polymeric materials and the like. Carbon nanomaterials can be mixed with these other nanomaterials.

The present invention has the advantage of being quick and easy compared to prior art methods of producing metal electrodes by patterning and etching.

It is therefore an object of the present invention to provide for an electrodynamic arrays deposited onto a variety of substrates, both rigid and flexible.

It is another object of the present invention to provide for electrodynamic arrays deposited onto flexible substrates, including transparent materials and fabrics.

It is a further object of the present invention to provide for a method of producing electrodynamic arrays using liquid solutions of nanomaterials.

It is a still further object of the present invention to provide for a method of producing electrodynamic arrays using liquid solutions of carbon nanomaterials.

It is also an object of the present invention to provide for a method of making electrodynamic arrays that is quicker and easier than producing metal electrodes by patterning and etching.

These and other features, objects and advantages of the present invention will become better understood from a consideration of the following detailed description of the preferred embodiments and appended claims in conjunction with the drawings as described following.

DETAILED DESCRIPTION OF THE INVENTION

Figure 1:
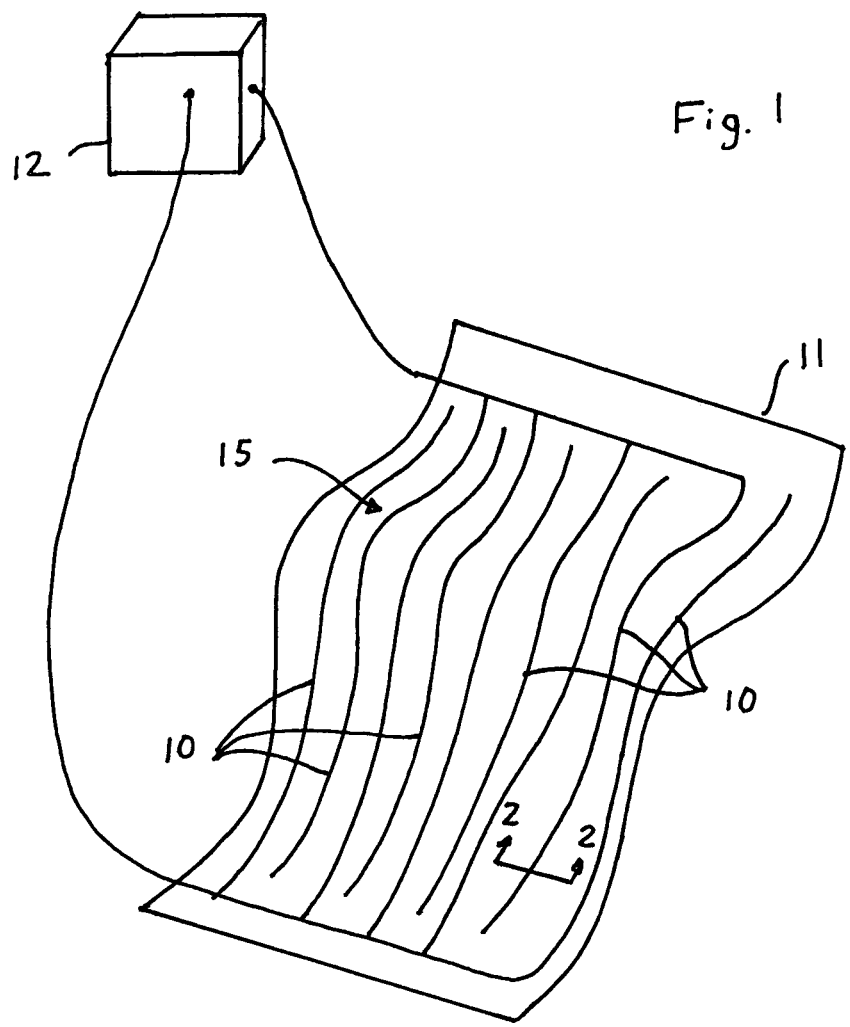
FIG. 1 is a perspective view of an embodiment of the present invention.
Figure 2:
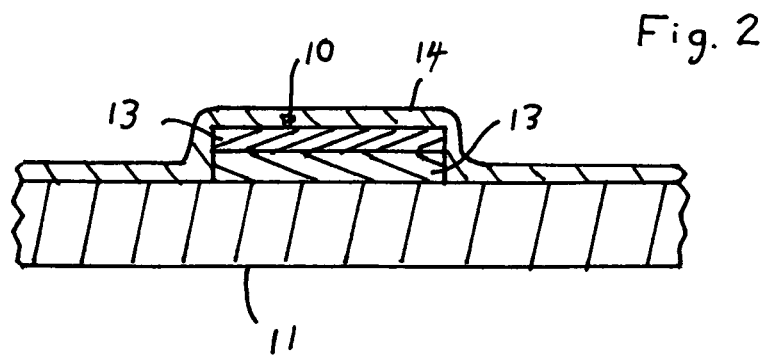
FIG. 2 is a cross-sectional view of an electrode taken along the line 2-2 of FIG. 1.

With reference to FIGS. 1 and 2, the preferred embodiments of the present invention may be described.

The present invention deposits liquid solutions (also referred to herein as "inks") of a liquid carrier containing nanomaterials on any of various substrates 11, both rigid and flexible, as electrodynamic arrays 15 of conductive electrodes 10 forming electrodynamic patterns for the movement and separation of materials. The substrates 11 may include polymeric substrates, optical devices, aircraft components, windshields and the like. Flexible substrates may include fabrics.

The present invention may also be applied to both transparent and opaque substrates. Specific substrates may include, without limitation, clothing, optical devices such as windows, lenses, windshields and other metallic or non-metallic devices.

The liquid solution of nanomaterials can be deposited on the substrate 11 using various deposition methods that include, without limitation, printing, electrospray, microfabrication, electrostatic deposition, self-assembly, patterning, electroprinting, and other deposition techniques known to those skilled in the art.

Electrodynamic patterns used in the practice of the present invention may include any pattern known to those skilled in the art for creating electrodynamic arrays 15, including, without limitation, single, double, or multiple phase designs. An electrodynamic array 15 is deposited on a substrate 11 as an array of conductive electrodes 10. The width of the electrodes 10 can vary from 0.1 nm to several cm. The spacing between the electrodes 10 can vary between 0.1 nm and several cm. The electrodes 10 can be straight lines, circular, spiral, or other shapes. The electrodes 10 of the electrodynamic arrays 15 are electrically connected to a suitable source of electrical power 12 to operate the electrodynamic arrays 15 for particular separation and movement applications, including dust mitigation.

The liquid solutions may be solutions of carbon nanomaterials, other nanomaterials or combinations of both. Various formulations of nanomaterial inks including carbon nanomaterial inks suitable for the practice of the present invention are known in the art. For example, the carbon nanotube coating described in "Comparative Study on Different Carbon Nanotube Materials in Terms of Transparent Conductive Coatings," Langmuir, Vol. 24, No. 6, pp. 2655-2662, 2008 and in "$SOCl_2$ enhanced photovoltaic conversion of single wall carbon nanotube/n-silicon heterojunctions,"Applied Physics Letters, Vol. 93, pp. 243117-1-243117-3, 17 Dec. 2008, has been found to be effective in the practice of the present invention. This coating is a liquid solution of single wall carbon nanotubes (SWCNTs) dispersed in a solution of dimethylformamide (0.5 mg/ml) by sonication. The conductivity of the SWCNTs may be enhanced by treatment with thionyl chloride ($SOCl_2$).

Suitable liquid carriers for the nanomaterials in the liquid solutions include polar or non-polar solvents, water and the like.

The liquid solutions or inks may contain various carbon nanomaterials, including, without limitation, single, double, multi-walled nanotubes, nanofibers, graphitic sheets, graphene layers, graphite, fullerenes and the like, including combinations of any of the preceding. Such inks may be used to produce electrodes 10 for electrodynamic arrays 15 that provide electrical conductivity along with flexibility and transparency. The liquid solution can be formed of one type of carbon nanomaterial or a combination of two or more such carbon nanomaterials.

Carbon nanomaterial based inks may be mixed with other nanomaterials that include, without limitation, organic and inorganic nanomaterials, including metal nanostructures, metal oxide nanostructures, nanocrystals, polymeric nanostructures, DNA, RNA, proteins, and the like, including any combination of the preceding. These other nanomaterials may also be used in the inks without the admixture of carbon nanomaterials.

Also the liquid solution may contain a number of inorganic nanomaterials to improve the electrical properties or to provide optical capabilities, for example quantum dot crystals.

In one embodiment of the present invention, the inks may include carbon nanomaterials functionalized with various functional groups by using chemical methods, or gas discharge procedures. A variety of functional groups can be considered that contain elements such as: O, $O_2$, H, $H_2$, C, S, Cl, N, I, F, Br and other elements that can improve the individual dispersion of the nanomaterials. Such groups can include, but are not limited to, alcohol, aldehyde, amide, amine, carboxylic, carbonyl, ester, ether, ketone, alkenyl, alkynyl, alkyl, benzyl, phenyl, chloro, fluoro, halo, haloformyl, iodo, bromo, hydroxyl, carboxylate, carbonate, hydroperoxy, carboxamide, peroxy, ammonium, aldimide, ketimine, azide, imide, isocyanide, cyanate, azo, diimide, nitrate, isocyanate, nitro, nitrite, nitrile, phosphodiester, phosphine, phosphino, pyridyl, sulfide, thioether, phosphate, phosphonic, disulfide, thyocianate, thiol, sulfoxide, sulfonic, sulfonate and the like. The functionalized nanomaterials can be dispersed in a variety of liquid solutions that include polar or non-polar solvents, water, or any other liquid carrier.

In another embodiment, the carbon nanomaterials can be dispersed into inks individually or in small clusters by using DNA or RNA molecules. Also the nanomaterials can be coated with polymeric chains in order to ensure their dispersion in the desired liquid carrier. Concentrations of nanomaterials can range from $10^{-6}$ μg/mL to 1 g/mL.

The liquid solution as previously described can be printed onto various substrates 11 in one or more passes by using a regular ink-jet printer or any other type of printer. Multiple passes form a plurality of layers 13 of conductive nanomaterials. Each layer 13 increases the conductivity or reduces the resistivity of the electrode 10. The number of passes may be determined based on a desired conductivity or resistivity of the electrodes 10.

In another embodiment of the invention, the electrodes 10 are made of metal nanostructures that can be spherical, cylindrical, rods, triangular or various other shapes. The metal nanoparticles can be formed into electrodes 10 by the methods described above. The nanomaterials can be in a liquid solution or deposited directly onto the substrate 11; i.e., the electrodes 10 can be grown in situ.

In a further embodiment of this invention, the nanomaterials can be grown through processes such as chemical vapor deposition (CVD), physical vapor deposition (PVD), plasma enhanced CVD or PVD, e-beam deposition, pulsed laser deposition (PLD), or any other process that results in the formation of electrodes 10 comprising nanomaterials.

Once formed, the electrodes 10 containing carbon nanomaterials and/or a mixture of carbon nanomaterials with or without inorganic nanostructures can be coated with a transparent polymeric or inorganic coating 14 as protection from environmental conditions.

In order to ensure a high adhesion and uniform coverage of the electrode areas, any of various pre-deposition treatments can be applied to the substrate 11, including plasma surface modification, corona discharge modification, chemical modification, electrochemical modification or the like to increase the wettability of the substrate and result in a more uniform electrode formation.

The invention may have many applications where it is desirable to mitigate dust on the surfaces of flexible materials, such as fabrics. For example, spacesuits used on the Moon or Mars may require periodic removal of dust from their surfaces. The present invention may be applied to imprint electrodynamic screen patterns directly onto the spacesuit fabrics for dust mitigation. Civilian applications may include solar panel coverage, windshields, windows, optical devices, aircraft coatings, blades and the like.

The present invention has been described with reference to certain preferred and alternative embodiments that are intended to be exemplary only and not limiting to the full scope of the present invention as set forth in the appended claims.

What is claimed is:

1. An electrodynamic array, comprising:
    a substrate;
    a multi-phase alternating current power source;
    a first electrode pattern comprising a first set of electrodes printed onto the substrate using ink comprising conductive nanomaterials, wherein the first electrode pattern is electrically connected to the power source to provide power to the first set of electrodes; and
    a second electrode pattern comprising a second set of electrodes printed onto the substrate using ink comprising conductive nanomaterials, wherein the second electrode pattern is electrically connected to the power source to provide power to the second set of electrodes that is out of phase with the power that the power source provides to the first set of electrodes;
    wherein the second set of electrodes is interleaved with the first set of electrodes on the substrate to repel dust from the surface when power is provided to the first electrode pattern and the second electrode pattern by the power source.

2. The electrodynamic array of claim 1, wherein said nanomaterials comprise carbon nanomaterials.

3. The electrodynamic array of claim 2 wherein said carbon nanomaterials are selected from the group consisting of single, double and multi-wall carbon nanotubes, nanofibers, graphitic sheets, graphenes, graphite, fullerenes and a combination of any of the preceding.

4. The electrodynamic array of claim 1, wherein said nanomaterials are selected from the group consisting of organic and inorganic nanomaterials, including metal nanostructures, metal oxide nanostructures, nanocrystals, polymeric nanostructures, DNA, RNA, proteins, quantum dot crystals and any combination of the preceding.

5. The electrodynamic array of claim 1, wherein comprise a plurality of layers of nanomaterials.

6. The electrodynamic array of claim 1, wherein said substrate is a rigid substrate.

7. The electrodynamic array of claim 1, wherein said substrate is a flexible substrate.

8. The electrodynamic array of claim 7, wherein said flexible substrate is a transparent material.

9. The electrodynamic array of claim 7, wherein said flexible substrate is an opaque material.

10. The electrodynamic array of claim 7, wherein said flexible substrate is a fabric material.

* * * * *